United States Patent

[11] 3,596,199

[72] Inventor David Hafler
Merion Station, Pa.
[21] Appl. No. 578,408
[22] Filed Sept. 9, 1966
[45] Patented July 27, 1971
[73] Assignee Dynaco, Inc.
Philadelphia, Pa.

[54] TRANSISTORIZED AMPLIFIERS AND PROTECTIVE CIRCUITS THEREFOR
9 Claims, 1 Drawing Fig.

[52] U.S. Cl. ........ 330/207 P, 330/24, 330/17, 330/15, 330/14
[51] Int. Cl. ........ H03f 21/00
[50] Field of Search ........ 330/11, 13; 307/202

[56] References Cited

UNITED STATES PATENTS 3,376,388 4/1968 Reiffin ........ 330/13 X

*Primary Examiner*—Nathan Kaufman
*Attorney*—Hurvitz, Rose & Greene

ABSTRACT: A protective circuit for a transistor amplifier having a driver stage and an output stage. The driver stage has a pair of series connected transistors in class B configuration and operates as a phase inverter in response to audio signal applied to a common input point to supply balanced oppositely phased signals to the output stage, the latter comprising a pair of series connected class B transistors having input circuits responsive respectively to the oppositely phased signals to supply a substantial replica of the input audio signal to a load connected to the junction of their output circuits. The overall amplifier has unity voltage gain, but provides a power gain with transition form high impedance source to low impedance load. A normally conductive electronic switch in a negative feedback path from output load point to output circuits of driver stage transistors is rendered nonconductive to open the feedback path and thereby prevent continuance of output DC level shifts normally mirroring input DC level shifts which would otherwise lead to self-destructive current multiplication, in the event of overdrive. A further normally nonconductive electronic switch in a path between output load point and input signal point of the overall amplifier is rendered conductive, in that event, to cut off audio signal through the amplifier.

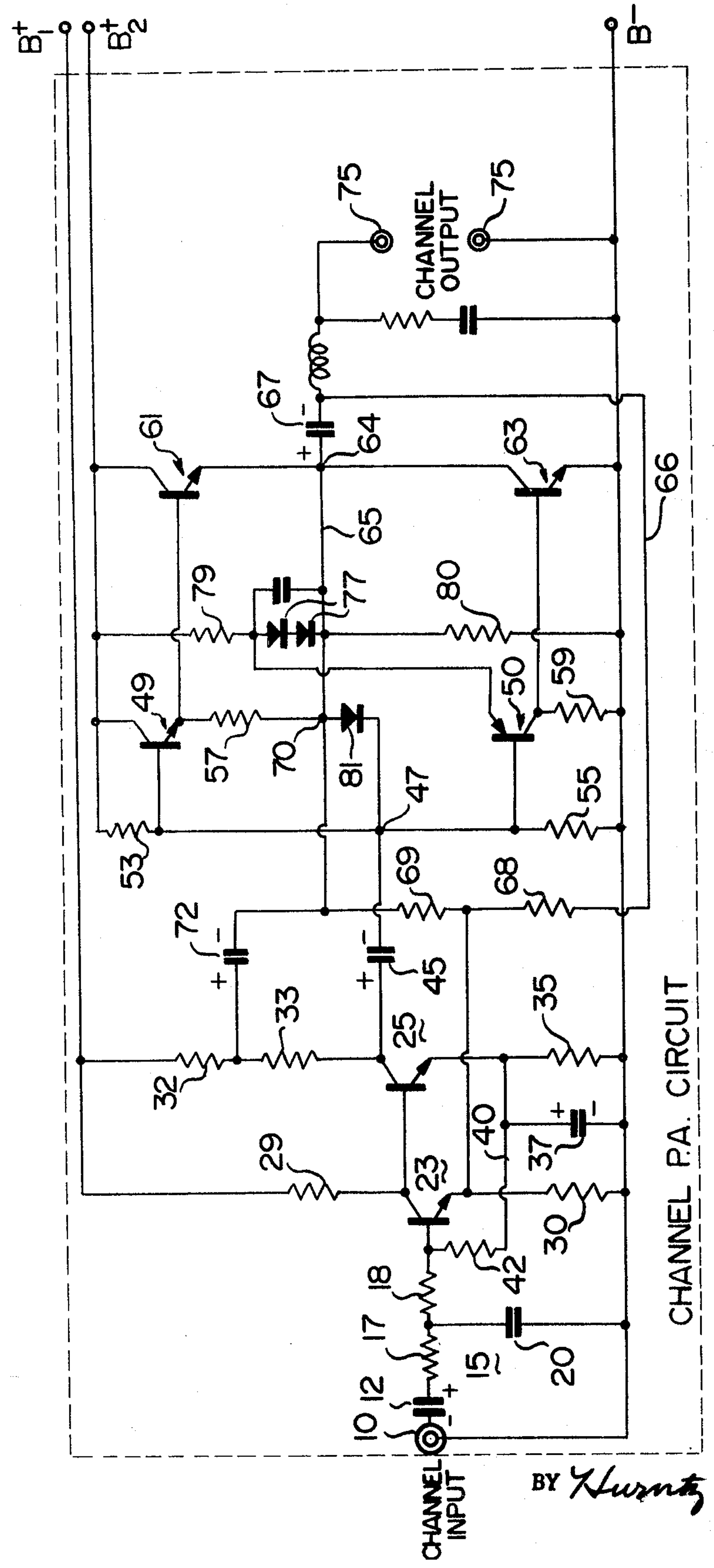
INVENTOR
DAVID HAFLER
BY Hurvitz & Rose
ATTORNEYS

TRANSISTORIZED AMPLIFIERS AND PROTECTIVE CIRCUITS THEREFOR

The present invention relates generally to transistorized power amplifiers, especially suitable for use in high quality sound systems such as stereo or monaural music reproduction systems, and more particularly to improved power amplifier configurations and to protective circuits therefor.

In my copending applications for United States Letters Patent on transistor amplifier protective circuits, Ser. Nos. 498,570 and 525,401 filed Oct. 20, 1965 and Feb. 7, 1966, respectively, I have disclosed circuit arrangements for preventing the maintenance of destructive current amplitudes in transistor amplifiers, such currents arising as a result of overdriving the amplifier. In the aforementioned applications, I refer in particular to a power stage configuration which forms the basis for many high quality transistor amplifiers, in which the output is taken from the junction of a pair of series-connected or complementary-symmetry output transistors. The output stage transistors are driven by balanced signals deriving from respective transistors of a complementary-symmetry phase inverter in response to input signal applied from the preceding stages of the overall amplifier circuit via a biasing arrangement to the input electrodes of the phase inverter stage transistors. Such power stage transistorized amplifier configurations provide no voltage gain between input and output, but function as buffer stages to effect a power transfer from the high impedance presented by the preceding stages to the low impedance presented by the load. Input and output signal of the power stage are of approximately the same amplitude.

The use of transistors as amplifying elements renders the circuit particularly to 4 which , as is well known, can rapidly result in thermal runaway and consequent transistor failure, in the event that an overdrive condition is permitted to exist for even a short interval. The overdrive may be the result of input signals of amplitude exceeding the recommended power handling capabilities of the transistors, or may be the result of excessive loading i.e. under-termination) of the output, or a combination of both.

In the specific and conventional power stage configuration to which I have referred above, at least one output stage transistor and an associated transistor of the phase inverter stage are coupled in a negative feedback loop which tends to correct for any DC shifts at the junction of the output stage transistors relative to the DC reference point existing at the input junction of the phase inverter transistors. Accordingly, as the transistors are subjected to overdrive currents each complementary transistor of the phase inverter must supply its respective output transistor with continually increasing current in order to maintain this input-output relationship, a situation which if permitted to continue, will lead rather rapidly to transistor self-destruction.

In my aforementioned application Ser. No. 498,570, now U.S. Pat. No. 3,372,344, I disclose a protective network for use with transistorized power stages of the type under discussion, by which there is eliminated any inherent maintenance of this DC input-output relationship in the amplifier, under conditions which would otherwise result in destructive transistor currents, through the operation of a current sensing circuit for opening the feedback path between input and output. To this end, a semiconductor junction diode is connected and poled from the emitter circuit of one transistor of the phase inverted of to the junction between the output stage transistors from which the output signal is taken. The diode is biased to conduction to permit passage of emitter bleed current in the forward direction and of feedback current in the reverse direction. When these two currents are equal, depending upon the component values and characteristics, the diode is rendered nonconductive and the feedback loop is opened. As further stated in the application, the diode and associated biasing components function also as a variable biasing network for the amplifier to prevent cutting off of the transistors at low signal levels and the consequent low level notch, as would otherwise occur in the transistor transfer characteristics. At high signal levels, on the other hand, the biasing is automatically removed, so that distortion is eliminated over a much wider range of input signal levels than could otherwise be accommodated.

In the other application to which I have referred, Ser. No. 525,401, I disclose another protective circuit arrangement for power stage configurations of the type presently under discussion. Again, damage to the transistors in the event of overdrive is prevented, except that in the circuit of the latter application the low impedance output load of the amplifier is utilized to advantage to short circuit the high impedance amplifier input when such a condition obtains. To this end, one or more switching elements are connected between amplifier output and input and biased in such a manner that switching from a normally nonconductive state to a conductive state is achieved when transistor current reaches a predetermined level below that level which would ordinarily result in self-destruction. In another form of that invention, the amplifier remains cut off until the excessive driving signal, or excessive loading, or both, is removed. Briefly, the former object is achieved in one embodiment of that invention by series connecting a pair of diodes between the input electrodes of the phase inverter transistors and providing a short circuit from the output terminal of a resistor from which the output signal of the amplifier is taken to the junction of the diode pair. Under normal input signal conditions, the diodes remain biased to a nonconductive state despite the difference in potential between amplifier output and input caused by the voltage drop across the resistor. However, when peaks of the input signal are excessive or when the output of the amplifier is overloaded, as may occur in the case of a short circuit across the amplifier output terminals, the drop across the resistor produces a forward bias on one of the two diodes, resulting in a short circuit between amplifier input and output and effective limiting of the input signal, thereby preventing destructive transistor currents. The objective of amplifier cutoff during periods of overdrive is achieved in another embodiment of that invention by connecting a further pair of diodes to the junction from which the input signal is obtained and connecting a capacitor across this further pair of diodes as well as across the input electrodes of the complementary-symmetry transistors of the power stage. These additional diodes serve as biasing elements for the transistors, but more importantly, are effective to rectify the input signal at such times when either of the first-mentioned pair of diodes becomes conductive. The rectified voltage is stored by the capacitor and serves to maintain a forward bias on the diode as long as the excessive input signal condition or overloaded output condition persists. Hence, the amplifier remains cut off until the undesirable condition is corrected.

It is a primary object of the present invention to provide transistor amplifier protective circuits which include the several advantages of both of my aforementioned protective networks.

Briefly, according to the present invention the series connected or complementary output stage transistors are again driven by complementary phase inverter transistors in a power stage configuration having no voltage gain, but providing a power gain and effecting power transfer from a high input impedance to a low output impedance. As in the case of the invention disclosed in my copending application Ser. No. 498,570, a semiconductor junction diode is connected for forward conduction between the emitter circuit of one of the drive or phase inverter stage transistors and the output junction between the series-connected output stage transistors. Also as in the previous invention, the diode is biased to permit passage of bleed current in from forward direction and feedback current in the reverse direction so that if and when these currents are equal the diode is rendered nonconductive and the feedback loop is opened. Hence, the output no longer follows the input and the output cannot be driven into a destructive region of the characteristics. When the diode becomes nonconductive, the output current is limited; and this current limit is maintained under continued drive conditions. The present invention adds a diode between the input terminal and the output terminal of the overall power stage configuration, poled for current conduction in the forward direction from output to input. The latter diode is normally nonconductive because of the existing DC voltage difference between input and output of the power stage as set by the first-mentioned diode. When the first-mentioned diode switches to a nonconductive state, however, this voltage difference or voltage offset is removed, and the last-mentioned diode is thereby rendered conductive to short circuit the input and output terminals of the power stage. Accordingly, a positive feedback path is established between output and input of the power stage (i.e., from collector of an output stage transistor to base of a phase inverter transistor) and the output stage is thus driven into a high impedance mode. The output current is reduced to approximately zero as long as the overdrive condition, which again may be the result of excessive input signal or overloading (under-termination) of the output, persists. It will be observed that the present invention not only includes the several advantages of the inventions disclosed in both aforementioned copending applications, but improves on mere current limiting in the presence of overdrive by effecting an actual current reduction.

It is therefore a more specific object of the present invention to provide a protective circuit for transistor amplifiers by which current through the transistors is reduced to approximately zero value in the event of an overdrive condition.

Further features of the present invention relate to the structure and operation of the overall amplifier of which the aforementioned power stage configuration is a component part. Briefly, the overall amplifier is a power amplifier which may be utilized, for example, in each channel of a stereo system and which includes two principal stages. The first stage is utilized to provide high voltage gain, and the second is the power stage or buffer stage configuration referred to above. Each of these principal or basic stages is DC feedback stabilized; and, unlike prior art DC arrangements, AC coupling is provided between the two stages. The present arrangement is simple and efficient, and reflects the fact that optimum AC and DC operating conditions will generally differ for the amplifier so that an all DC connected amplifier cannot be operationally optimized for AC signals.

Accordingly, it is a further object of the present invention to provide an improved power amplifier particularly suitable for music reproduction systems, and wherein a pair of DC feedback stabilized stages are AC coupled.

The above and still further objects, features and attendant advantages of the present invention will become apparent from a consideration of the following detailed description of a preferred embodiment thereof, especially when taken in conjunction with the accompanying drawings in which:

The sole FIGURE is a circuit diagram of a power amplifier embodying the principles of the present invention.

Referring now to the drawing, the overall power amplifier may be one of a pair of such amplifiers for the right and left channels of a stereo system. For this purpose the amplifier shown in the FIGURE would merely be duplicated for the opposite channel. In any event, the amplifier includes a coaxial input jack 10, to the inner conductor of which the audio input signal is applied, the outer conductor being coupled to a source of reference potential indicated as B−.

Preferably the power supply for the amplifier is constructed in accordance with one or more of the embodiments of copending application of Hafler et al., Ser. No. 491,588, filed Sept. 30, 1965, and entitled "Electronic Regulator." The present invention, however, is not limited to use with any particularly power supply and any conventional supply may be utilized, as desired. Signal is fed through an input coupling capacitor 12 and thence through a low pass filter 15, comprising series-connected resistors 17 and 18 and shunt capacitor 20, to the base electrode of NPN transistor 23. The latter transistor and a second NPN transistor 25 are each connected in common emitter configuration and cascaded to provide the desired signal gain. Transistor 23 is provided with a load resistor 29 and with an emitter resistor 30, the latter for DC stabilization. Similarly, transistor 25 is provided with load resistance, split into two separate resistors designated 32 and 33, and with a stabilizing resistor 35 in the DC emitter path thereof. In addition, an AC bypass capacitor 37 is connected in parallel with resistor 35 of transistor 25. Additional DC stabilization is provided by a feedback path 40, including resistor 42, connected from the high (positive) side of resistor 35 and capacitor 37 to the base electrode of transistor 23.

The output of the first basic stage of the amplifier is AC coupled to the input of the second stage via a capacitor 45 connected from the collector electrode of transistor 25 to a junction 47 connecting the base electrodes of transistors 49 and 50. The latter transistors are coupled in complementary phase inverter configuration in the power stage. Resistors 53 and 55 are connected from input terminal 47 to either terminal of the network power supply in a voltage divider arrangement.

Oppositely phased output signals are taken respectively from the junction of the emitter electrode of transistor 49 and load resistor 57 and from the junction of the collector electrode of PNP transistor 50 and load resistor 59, for application to the base electrodes of respective output stage transistors 61 and 63. The output circuits (emitter-collector paths) of transistors 61 and 63 are connected in series across the network power supply. The amplifier output is taken from the junction 64 between the series-connected output stage transistors, i.e., the point at which emitter electrode of transistor 61 and collector electrode of transistor 63 are connected, and is directly connected to a node 70 at an end of load resistor 57 of phase inverter transistor 49 remote from the emitter electrode thereof, and indirectly to the emitter electrode of transistor 50, via a feedback path 65. A second feedback path 66 includes output coupling capacitor 67 and a pair of resistors 68 and 69, the latter also connected to node 70. A bootstrap capacitor 72 couples inner feedback loop 65 to the junction of the split load resistors 32 and 33, i.e. to a tap on the collector resistor of driver transistor 25.

It will be observed that the latter connection differs from the conventional manner of bootstrapping in that the normal position of the bootstrap is a connection to the base resistor 53 or 55 which are then required to be of relatively low impedance. In accordance with the present invention, the bootstrap capacitor is connected in separate circuit enclosing intermediate coupling capacitor 45, permitting resistors 53 and 55 to be any desired impedance.

Inner feedback loop 65 imposes a DC unbalance on the output of the overall amplifier, which may be compensated by inclusion of a resistor (not shown), having a value corresponding to that of resistor 69, from the center line of the power stage (i.e., node 70) to the positive terminal of the power supply. Balancing of the DC at node 70 is essential to reduce distortion at low signal levels; hence, provides a substantial, but amplified, replica of the input signal at the channel output terminals 75.

A pair of series connected diodes 77, poled in the forward direction from the emitter of transistor 50 to the inner feedback loop 65, and a pair of bleeder resistors 79 and 80 connected respectively from anode and cathode of the pair of series-coupled diodes to opposite terminals of the network power supply, function in a manner corresponding to that disclosed in my aforementioned copending application, Ser. No. 498,570. That is, a portion of the output current flowing through the output stage transistors 61 and 63 is fed back via conductive path 65, the inner feedback loop, to at least one of the complementary symmetry phase inverter transistors.

Since the base of each phase inverter transistor is referenced for direct current by the voltage dividing resistors 53 and 55 connected across the power supply, any DC shifts relative to that reference point which may occur at junction 64 of output stage transistors 61 and 63 tend to be corrected by the current through the output stage transistors. A portion of that current is fed back to the phase inverter transistors via part 65; hence, if the power stage is overdriven by application of excessive input signal to its input terminal or by undertermination (i.e., heavy loading) at its output terminals, the phase inverter would normally supply increased current to the output stage transistors in order to maintain the DC relationship between input junction and output junction. The dangers of this increased output stage current have been discussed. Diodes 77 in conjunction with the bleeder resistors 79 and 80 operate to open the inner feedback loop 65 during the existence of such overdrive conditions. It will be observed, in this respect, that diodes 77 are forward biased by their connection to the respective terminals of the network power supply through the bleeder resistors. During normal circuit operation, then, these diodes are in the conductive state. However, when the current through phase inverter transistor 50 is equal to that through the path comprising the bleeder resistors and the diodes, the two currents cancel and no current flow exists through diodes 77. It will be apparent that under this condition the feedback loop normally existing between the junction of output stage transistors 61 and 63 and the emitter of transistor 50 via the diodes 77 is opened by the biasing of diodes 77 to their nonconductive stage. As a result the output no longer follows the input and the output stage cannot be driven into a destructive region of the transistor characteristic curves. When diodes 77 are rendered nonconductive the output current through coupling capacitor 67 is effectively limited but this current can be maintained under continued overdrive conditions.

According to the present invention a further diode 81 is connected and poled in the forward direction between node 70 and input terminal 47 of the power stage. When diodes 77 are in their normal conductive state, under conditions of appropriate driving signal levels at input terminal 47, a slight DC voltage difference or offset voltage exists between input and output of the power stage such that the anode of diode 81 is negatively biased with respect to the cathode thereof. This reverse bias is effective to render diode 81 normally nonconductive as long as diodes 77 remain in the conductive state. When, however, diodes 77 are switched to a nonconductive state, under conditions of overdrive, diode 81 is biased or switched to conduction by elimination of the offset voltage.

Diode 81 then establishes a positive feedback connection from collector of output stage transistor 63 to base of phase inverter transistor 50. Such positive feedback is accompanied by a driving of the output stage into a high impedance mode, i.e., near or into cutoff, so that little or no current can flow through the output stage transistors.

Consequently, there is an improvement upon simple current limiting in that a current reduction through the transistors is obtained when the loading is increased beyond the predetermined maximum acceptable current level.

I claim:

1. A protective network for a transistor amplifier circuit having a pair of transistors with series-connected output circuits and with input circuits driven by respective outputs of complementary phase inverter transistors to which the amplifier input signal is applied, said network comprising a negative feedback path between the junction of said series-connected output circuits and at least one of said phase inverter transistors; switching means capable of being biased to either a conductive or a nonconductive state in said feedback path, means normally biasing said switching means to a conductive state, and biasing said switching means to a nonconductive state when the current through said feedback path reaches a predetermined level indicative of excessive transistor current; further switching means capable of being biased to either a conductive or a nonconductive state; said further switching means connecting said junction to the signal input terminal of said amplifier circuit; said further switching means normally biased to a nonconductive state by the normally conductive condition of the first-named switching means, and biased to a conductive state in response to the assumption by said first-named switching means of a nonconductive state for driving said amplifier circuit into a cutoff condition.

2. The combination according to claim 1 wherein said first-named and further switching means are diodes.

3. A transistorized power amplifier for audio input signal, comprising

- a first transistor amplifier stage for providing high voltage gain,
- feedback means for DC stabilization of said first stage;
- a second transistor amplifier stage for providing an impedance buffer and a power gain, said second stage including
  - a pair of complementary symmetry transistors responsive to audio output signal from said first amplifier stage applied to a common input junction of said pair for developing balanced oppositely phased signals and
  - a further pair of transistors having series-connected output circuits and having input circuits responsive respectively to said oppositely phased signals to provide the audio output signal of the overall amplifier;
- feedback means for DC stabilization of said second stage; and
- means AC coupling the high gain output of said first stage to said common input junction of said complementary symmetry transistors;
- said second stage including means for cutting off the last-named audio output signal by reduction of transistor currents in said second stage in response to said transistor currents exceeding a predetermined acceptable level.

4. A transistorized power amplifier, comprising a first stage of cascaded transistors for providing high signal gain, feedback means for DC stabilization of said first stage; a second stage including a pair of complementary transistors connected to supply balanced oppositely phased signals in response to application of signal to a common input junction thereof, and a further pair of transistors having series-connected output circuits and having input circuits responsive respectively to said oppositely phased signals to provide the output signal of said amplifier, feedback means for DC stabilization of said second stage; and means AC coupling the high gain output of said first stage to said common input junction of said complementary transistors; said second stage including means for cutting off signal therethrough in response to the transistor currents therein exceeding a predetermined acceptable level, the last-named means including normally conductive switching means supplying a negative feedback path from one of said further pair of transistors to one of said complementary transistors, and normally nonconductive switching means, responsive to the breaking of said negative feedback path by the energization of said normally conductive switching means to a nonconductive state in the presence of said transistor currents exceeding said level, for supplying a conductive path between the output junction of said series-connected output circuits and said common input junction.

5. The combination according to claim 4 wherein said switching means are diodes.

6. A transistor amplifier for amplification and power transfer of audio signal from a source thereof to a load, said amplifier comprising

- a high input impedance complementary-symmetry phase inverter including a pair of transistors of opposite conductivity types concurrently responsive to audio signal applied in parallel thereto for developing balanced oppositely phased signals representative of the applied audio signal,
- an output stage including a further pair of transistors having their output circuits coupled at a common output junction to provide a low output impedance and having input circuits respectively responsive to said oppositely phased signals for producing at said output junction an audio output signal constituting a substantial replica of said applied audio signal, a negative feedback network from said further pair of transistors to said phase inverter for DC stabilization of that portion of said amplifier including said phase inverter and said output stage, means in said feedback network responsive to overdriving of said portion of said amplifier to open said feedback network, and means coupled to said feedback network and to said phase inverter and responsive to the opening of said feedback network for cutting off audio signal through said portion of said amplifier.

7. The amplifier according to claim 6 wherein said feedback network comprises an electrical connection from said common output junction of said output stage to the output circuits of said phase inverter transistors, and wherein said means for opening said feedback network includes at least one normally forward biased semiconductor diode in said electrical connection.

8. The amplifier according to claim 7 wherein said means for cutting off audio signal includes a normally reverse biased semiconductor diode connected between said output junction and the input circuits of said phase inverter transistors and responsive to said opening of said feedback network to switch to a forward biased state in the direction of said input circuits.

9. A protective circuit for a transistor amplifier, said amplifier comprising a driver stage including a pair of series-connected transistors in class B configuration having a common signal input point and responsive to audio signal applied thereto to produce a pair of balanced oppositely phased output signals, an output stage including a pair of series-connected class B transistors having an output load point at the junction therebetween and responsive respectively to said oppositely phased signals to produce a substantial replica of said audio input signal at a load connected to said output point, said amplifier having substantially unity voltage gain and effecting a transition between a high impedance source of said audio signal and a low impedance load, and a feedback path from said output load point to said driver stage to correct DC level shifts relative to a DC reference level at said signal input point;

said protective circuit comprising first electronic switch means in said feedback path, means normally rendering said first switch means conductive to close said feedback path, and responsive to overdriving of said amplifier to render said first switch means nonconductive, whereby to open said feedback path and prevent destructive current multiplication therethrough as a result of said level shift correction, and second electronic switch means connecting said output load point to said signal input point, and responsive to said feedback path being in a closed condition to assume an open state, and responsive to said feedback path being in an open condition to assume a closed state, whereby to prevent signal passage through said amplifier in the event of overdrive of said amplifier.